United States Patent
Jain et al.

(10) Patent No.: US 11,270,977 B2
(45) Date of Patent: Mar. 8, 2022

(54) POWER DELIVERY NETWORK FOR ACTIVE-ON-ACTIVE STACKED INTEGRATED CIRCUITS

(71) Applicant: XILINX, INC., San Jose, CA (US)

(72) Inventors: Praful Jain, San Jose, CA (US); Steven P. Young, Boulder, CO (US); Martin L. Voogel, Niwot, CO (US); Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 214 days.

(21) Appl. No.: 16/679,063

(22) Filed: Nov. 8, 2019

(65) Prior Publication Data

US 2021/0143127 A1    May 13, 2021

(51) Int. Cl.
*H01L 25/065*    (2006.01)
*H01L 25/00*    (2006.01)

(52) U.S. Cl.
CPC .......... *H01L 25/0657* (2013.01); *H01L 25/50* (2013.01); *H01L 2225/06513* (2013.01); *H01L 2225/06517* (2013.01); *H01L 2225/06544* (2013.01)

(58) Field of Classification Search
CPC ... H01L 25/06; H01L 25/065; H01L 25/0657; H01L 25/50; H01L 2225/06; H01L 2225/065; H01L 2225/0651; H01L 2225/06513; H01L 2225/06517; H01L 2225/0654; H01L 2225/06544

USPC ..................................................... 257/621
See application file for complete search history.

(56) References Cited

U.S. PATENT DOCUMENTS

| | | | |
|---|---|---|---|
| 9,620,488 B2 * | 4/2017 | Yu | ......................... H01L 25/105 |
| 10,032,707 B2 | 7/2018 | Lai et al. | |
| 2013/0221499 A1 | 8/2013 | Karikalan et al. | |
| 2015/0187733 A1 | 7/2015 | Batra et al. | |
| 2016/0225679 A1 | 8/2016 | Kannan et al. | |
| 2018/0145030 A1 | 5/2018 | Beyne et al. | |
| 2019/0198443 A1 | 6/2019 | Nakano et al. | |

FOREIGN PATENT DOCUMENTS

EP    3324436 A1    5/2018

* cited by examiner

*Primary Examiner* — Monica D Harrison
(74) *Attorney, Agent, or Firm* — Patterson + Sheridan, LLP

(57) ABSTRACT

An apparatus includes a first die including a first substrate with first TSVs running through it, a first top metal layer and first chimney stack vias (CSVs) connecting the first TSVs with the first top metal layer. The apparatus further includes an uppermost die including an uppermost substrate and an uppermost top metal layer, and uppermost CSVs connecting the uppermost substrate with the uppermost top metal layer. The first and uppermost dies are stacked face to face, the first TSVs and the first CSVs are mutually aligned, and the dies are configured such that current is delivered to the apparatus from the first TSVs up through the first CSVs, the first and uppermost top metal layers, and the uppermost CSVs.

20 Claims, 12 Drawing Sheets

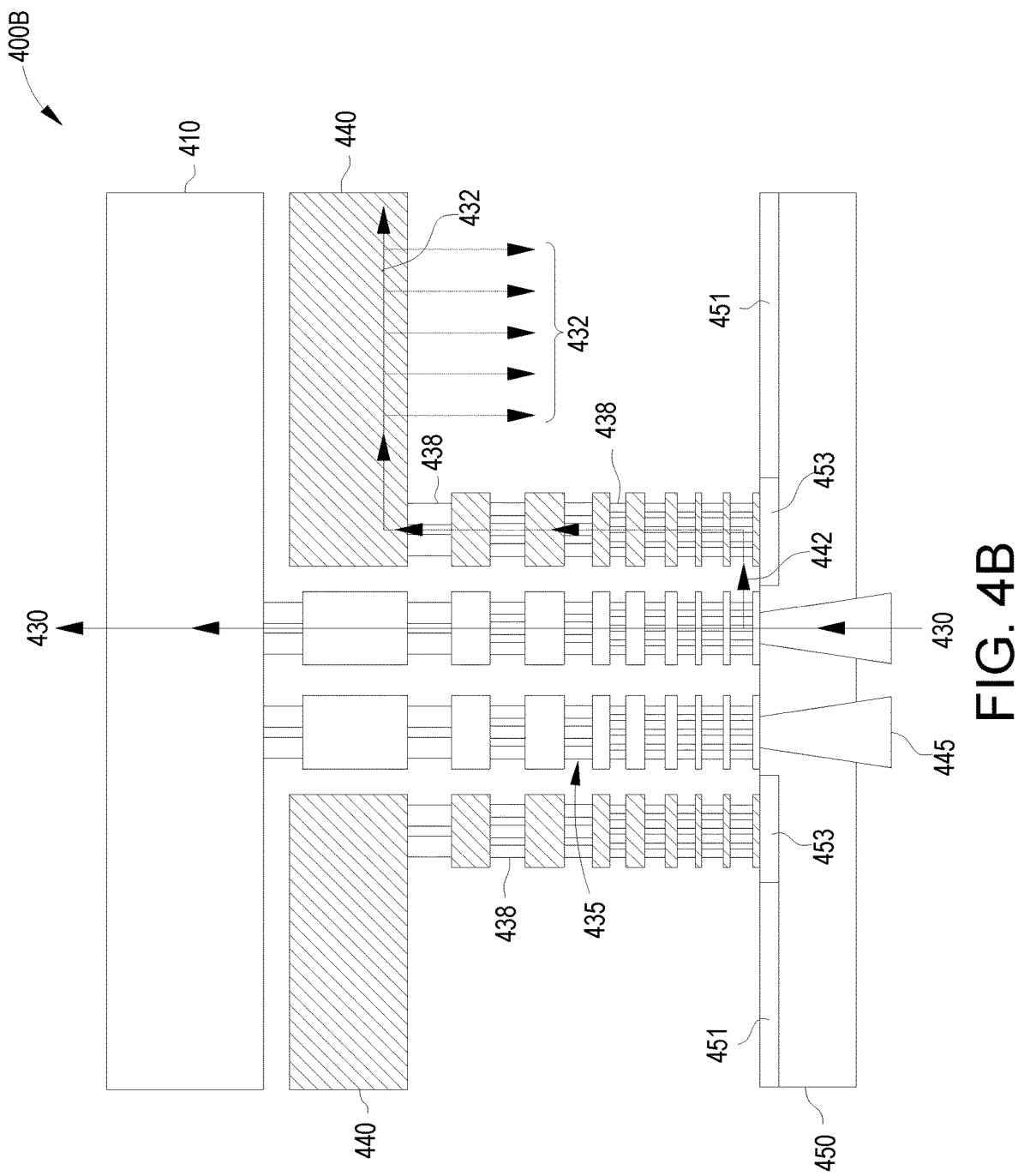

POWER DELIVERY NETWORK FOR ACTIVE-ON-ACTIVE STACKED INTEGRATED CIRCUITS

TECHNICAL FIELD

Examples of the present disclosure generally relate to stacked integrated circuits (ICs), and in particular to power delivery networks for active-on-active (AoA) stacked ICs.

BACKGROUND

It is generally believed that three-dimensional (3D) stacking of logic ICs is the future of high performance computing. This realization is related to the end of Moore's law, and the realization that power, performance and area returns are diminishing with conventional two-dimensional (2D) die scaling. However, one of the major challenges for 3D ICs is the provision of a power delivery network that supplies power and ground to all of the dice along the die stack.

It is noted that voltage drops have been worsening even in 2D contexts, such as, for example, in sub-14 nm processes, due to increasing metal resistance as well as the general lack of scaling of metal RCs. This is due to the fact that the IR drop gets progressively worse with each generation because metal width and spacing scales (shrinks) with each process node. As metal width and thickness scales with each node, resistance of the metal increases according to the formula $R=\rho*(L/A)$, where $A=(width)*(thickness$ of metal), $L$=length of metals, and $\rho$ (rho) is a constant for a given material. Thus, despite the shrink, power demand per unit area goes up with each generation, so current demanded through the now thinner wires increases. (Power per device goes down linearly, but devices per area goes up quadratically).

When extending logic ICs to the realm of 3D ICs, IR drops present an even greater concern. This is because in a 3D IC it is necessary to deal with both additional resistance along power rails due to through-silicon-vias (TSVs) as well as higher current densities resulting from a greater number of transistors per unit area.

SUMMARY

Examples described herein relate to power delivery networks for 3D stacked ICs that minimize IR drop through the die stack. Moreover, example power delivery networks described herein further minimize both disruption to the blocks on each layer as well as minimize area cost. In one example, a power delivery scheme includes power rails that are buried in a substrate. In another example, power delivery is provided from a top side, and augmented for 3D stacking.

An example is an apparatus. An apparatus comprises a first die comprising: a first substrate with first TSVs running through it, a first top metal layer and first chimney stack vias (CSVs) connecting the first TSVs with the first top metal layer, and an uppermost die comprising: an uppermost substrate and an uppermost top metal layer, and uppermost CSVs connecting the uppermost substrate with the uppermost top metal layer. The first and uppermost dies are stacked face to face, the first TSVs and the first CSVs are mutually aligned, and the dies are configured such that current is delivered to the apparatus from the first TSVs up through the first CSVs, the first and uppermost top metal layers, and the uppermost CSVs.

Another example is a method. A method comprises providing a first die comprising: a first substrate with first TSVs running through it, a first top metal layer and first chimney stack vias (CSVs) connecting the first TSVs with the first top metal layer, and providing an uppermost die comprising: an uppermost substrate and an uppermost top metal layer, and uppermost CSVs connecting the uppermost substrate with the uppermost top metal layer. The method further comprises stacking the first and the uppermost dies face to face and aligning the first TSVs, the first CSVs and the uppermost CSVs, and configuring the dies such that current is delivered through the first TSVs, the first CSVs, the first top metal layer, the uppermost top metal layer and the uppermost CSVs.

Another example is an apparatus. An apparatus comprises a substrate provided with power TSVs running through it, a top metal layer and first CSVs connecting the power TSVs with the top metal layer. The power TSVs and the first CSVs are aligned. The apparatus further includes one or more power gates provided on the substrate, each power gate coupled to one end of at least one CSV, and further coupled to a power delivery system of the apparatus.

These and other aspects may be understood with reference to the following detailed description.

BRIEF DESCRIPTION OF DRAWINGS

So that the manner in which the above recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope.

FIG. 4B illustrates power gates and a local chimney structure in a second example scenario where current enters from a TSV side of a substrate of a die and exits through a top metal layer of the die, according to some examples.

DETAILED DESCRIPTION

Examples described herein apply to efficient implementations of power networks to stacked ICs. In such examples, it is generally assumed that there is a 3D stacked device where the bottom two dies of the device are stacked face to face and the remaining dies are stacked face to back. This is illustrated in FIG. 1, next described.

Figure 1:
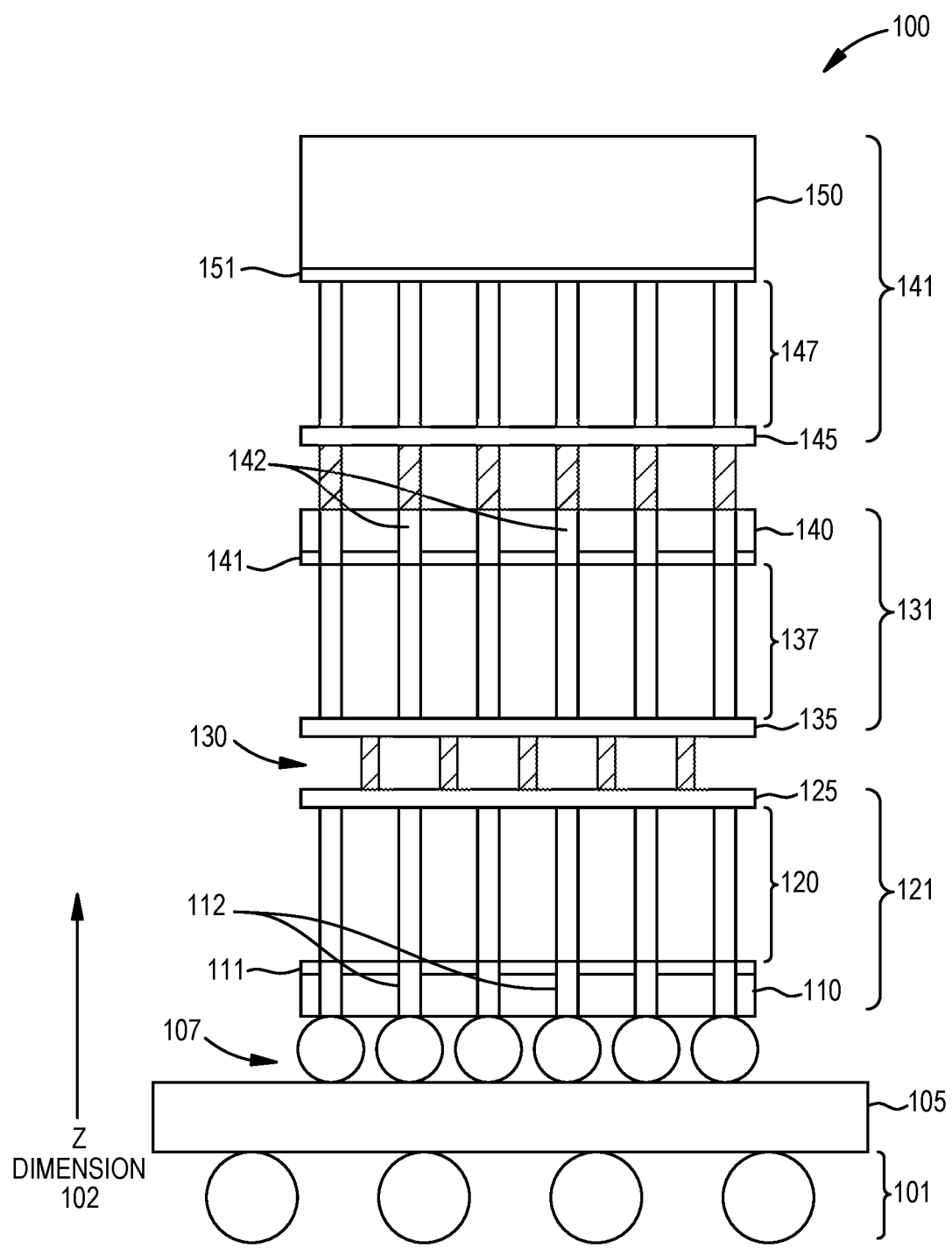
FIG. 1 is an example of an active-on-active die stack, according to some examples.

FIG. 1 illustrates a vertical cross section through an example AoA die stack 100 according to some examples. With reference thereto, beginning at the bottom of FIG. 1, there are shown ball grid array (BGA) balls 101. BGA balls 101 are used to mount the AoA die stack 100 onto a board or other base connection. Provided above and connected to BGA balls 101 is package substrate 105, on which the various dies of AoA die stack 100 rest. On top of package substrate 105 there are provided Controlled Collapse Chip Connection (C4) bumps 107. C4 bumps 107 are solder bumps used to interconnect a semiconductor device, such as, for example, a first silicon substrate 110 of the AoA die stack, to external circuitry. Thus, as shown in FIG. 1, C4 bumps 107 interconnect package substrate 105 with first silicon substrate 110.

First silicon substrate 110 is the bottom portion of a first die 121 of the example AoA device. All told, in the depicted example, there are three dice, namely, first die 121, intermediate die 131 and top die 141. Each die includes a substrate, intermediate metal layers, interconnections, and a top metal layer. Depending upon how that die is stacked relative to the dice underneath it, the substrate may be on top, as is the case with substrates 140 and 150, or at the bottom, as is the case with substrate 110. In other examples, there may be one or more additional intermediate dies 131 stacked on top of each other in the same way (e.g., "upside down", with substrate on top, metal face on the bottom). The three dice shown in FIG. 1 are next described in detail.

Beginning with first die 121, first silicon substrate 110 is made of a thinned wafer so that TSVs 112 may cross through it, at a fine pitch. In some examples the pitch may be in the range of 1 um-3 um. In contrast, because top silicon substrate 150 is not provided with TSVs through it, it is not thinned. In one example, top silicon substrate 150 is on the order of hundreds of times thicker than first silicon substrate 110. In one example, first silicon substrate 110 may have a thickness of 2-3 microns, and top silicon substrate 150 may have a thickness of 700 microns. In one example, first silicon substrate 110 is also provided with transistors 111 on its top surface, as shown. In one example, transistors 111 are powered via a local power mesh, described more fully below in connection with FIG. 4B.

Continuing with reference to FIG. 1, TSVs 112 run from the bottom surface of first silicon substrate 110, where they contact C4 bumps 107, through the entire first silicon substrate 110 and through the layer of transistors 111 provided on the top surface of first silicon substrate 110 to form a connection point for chimney stack vias (CSVs) 120, which extend upwards from first silicon substrate 110, as shown, through various intermediate metal layers of first die 121 to connect with first top metal layer 125, at which point the first die 121 of AoA die stack 100 ends. In one example CSVs 120 are one link in a global power delivery system that passes through all of the dies of the stacked IC device 100. In one example, to minimize IR drop across first die 121, C4 bumps 107, TSVs 112 and CSVs 120 are all aligned, as is illustrated in FIG. 1. Moreover, the smaller their pitch, e.g., the distance between individual ones of CSVs 120, the greater the IR drop. IR drop in the vertical direction (Z dimension 102 in FIG. 1) generally increases quadratically with the interfall distance between CSVs. Thus, in one or more examples, there is a tradeoff between IR drop and disruption of transistors and circuitry on a die in deciding at what pitch the TSVs and CSVs (which are the same on any single die, and, as described below, the same for all fabric dies) are to be provided.

Thus, assuming a coordinate space where the Z dimension is through die intermediate metal layers, as shown by Z dimension arrow 102, CSVs 120 require no X-Y routing on the intermediate metal layers through which they pass. Thus, in such example, there is no need to move any portion of any chimney stack in any front-back or right-left direction on any intermediate metal layer of first die 121.

Continuing with reference to FIG. 1, intermediate die 131 is next described. As noted, intermediate die 131 is stacked face to face with first die 121. Thus, top metal layer 135 of die 131 faces top metal layer 125 of first die 121, and in one example, they are die-to-die bonded. Thus there is effectively minimal, or ideally no, IR drop across the two top metal layers 125, 135.

Above top metal layer 135 of intermediate die 131 are provided CSVs 137, which connect top metal layer 135 of intermediate die 131 with the upper surface of substrate 140 of intermediate die 131. As was the case with CSVs 120 of the first die 121, CSVs 137 of intermediate die 131 pass through various intermediate metal layers of intermediate die 131 to connect with TSVs 142 of substrate 140, which pass through substrate 140, as shown, to end on the back surface of substrate 140. On the top surface of substrate 140 are provided transistors 111, and these are powered via a local power mesh, described more fully below in connection with FIG. 4A.

In one example, the first die 121 is an input/output (IO) die, and the intermediate 131 and uppermost 141 dies are fabric dies, respectively. In such example it is assumed that the power supply used by the upper die layers is not the same as the first or bottom die layer. This is because often times the first layer uses IO voltages and the upper dice use lower voltage digital logic voltages, for example. Thus, as shown in FIG. 1, while C4 bumps 107, TSVs 112 and CSVs 120 are mutually aligned, they are not also all aligned with the CSVs and TSVs of upper dies 131 and 141.

In one example, as shown in FIG. 1, there is alignment from C4 bumps 107 through the entire first die 121, ending at first top metal layer 125. Thus, in such example, C4 bumps 107, TSVs 112 and CSVs 120 are all mutually aligned. In some examples, the pitch of TSVs 112 and CSVs 120 (which is the same, as they are aligned), is uniform in each of the X and Y dimensions. In some such examples, it is the same pitch in both directions. In addition, in one example, there is also alignment throughout all of the upper dies, being intermediate die 131 and uppermost die 141. Thus, CSVs 137, which connect at their bottom surfaces to top metal layer 135 of intermediate die 131, and run through various internal metal layers of intermediate die 131, are aligned with TSVs 142 than run through intermediate silicon substrate 140, and CSVs 147, which run through various intermediate metal layers of top die 141, are themselves mutually aligned. This mutual alignment of TSVs and via chimneys throughout the die stack provides current pathways that do not change in X, Y co-ordinates as the current moves upward through the die stack. Thus, in such example, the pitch of CSVs 137, TSVs 142, and CSVs 147, which is the same, is uniform in each of the X and Y dimensions. In some such examples, it is the same pitch in each direction.

However, it is noted, while there are two domains in which TSVs and CSVs are mutually aligned, in this example, there is no alignment between the two domains themselves. Thus, there is no alignment between TSVs and CSVs of the first die 121 and TSVs and CSVs of the remaining dies 131 and 141, and thus, CSVs 120 of the first die are offset in the X/Y dimension from the CSVs 137 of the intermediate layer. This example of two separate alignment domains allows for a different pitch of TSVs in substrate 110 relative to the TSV pitch in substrate 140, for example.

In an alternate example (not shown in FIG. 1) it is possible to arrange stacked ICs such that the bottom layer is the same as the upper layers and shares the same power supply. In such an alternate example, by providing CSVs through the entire metal stack, the CSVs and TSVs may also all be aligned across all die layers. Thus, in such alternate example, by enabling current to travel straight up in the Z dimension 102 without any X/Y jogging, any repeated die to die resistance penalty that might otherwise be incurred is averted. In such alternate example (as noted, not shown in FIG. 1), TSVs 112 and CSVs 120 of first die 121 are aligned with CSVs 137 of intermediate die 131, TSVs 142 of intermediate substrate 140 and CSVs 147 of top die 141, which ultimately connect to transistors 151 provided on the top surface of top substrate 150.

Turning back to the example shown in FIG. 1, as noted, if a base die is different than upper layer fabric dies, it is likely that the base die circuits have their own power mesh and TSVs that reach up to this power mesh. The CSVs 120 handle power supply for the upper dies, and thus connect to a power mesh above the base die's power mesh. In this way, the only disruption to the IO die circuits of first die 121 are the infrequent CSVs used to get to the power mesh that is above the first die's power mesh. As noted, because first die 121 may have circuits of different dimensions than those on the upper dice, it may not be possible to continue the TSV chimneys all the way up the die stack without some X/Y jogging, as is shown in FIG. 1. As a result, there may likely be some IR drop penalty for the illustrated configuration. To mitigate this penalty, base die 121 terminates with a power mesh provided in top metal layer 125 that connects to a power mesh on the top metal layer 135 of the second die 131 using a sea of face to face via connections 130, so that any X/Y lateral current flow has many parallel paths to flow through. However, it is noted that to avoid the penalty completely, as in some examples, the intervals at which TSVs are placed on a base die is to be aligned with the intervals at which TSVs are placed on the fabric die.

Figure 2A:
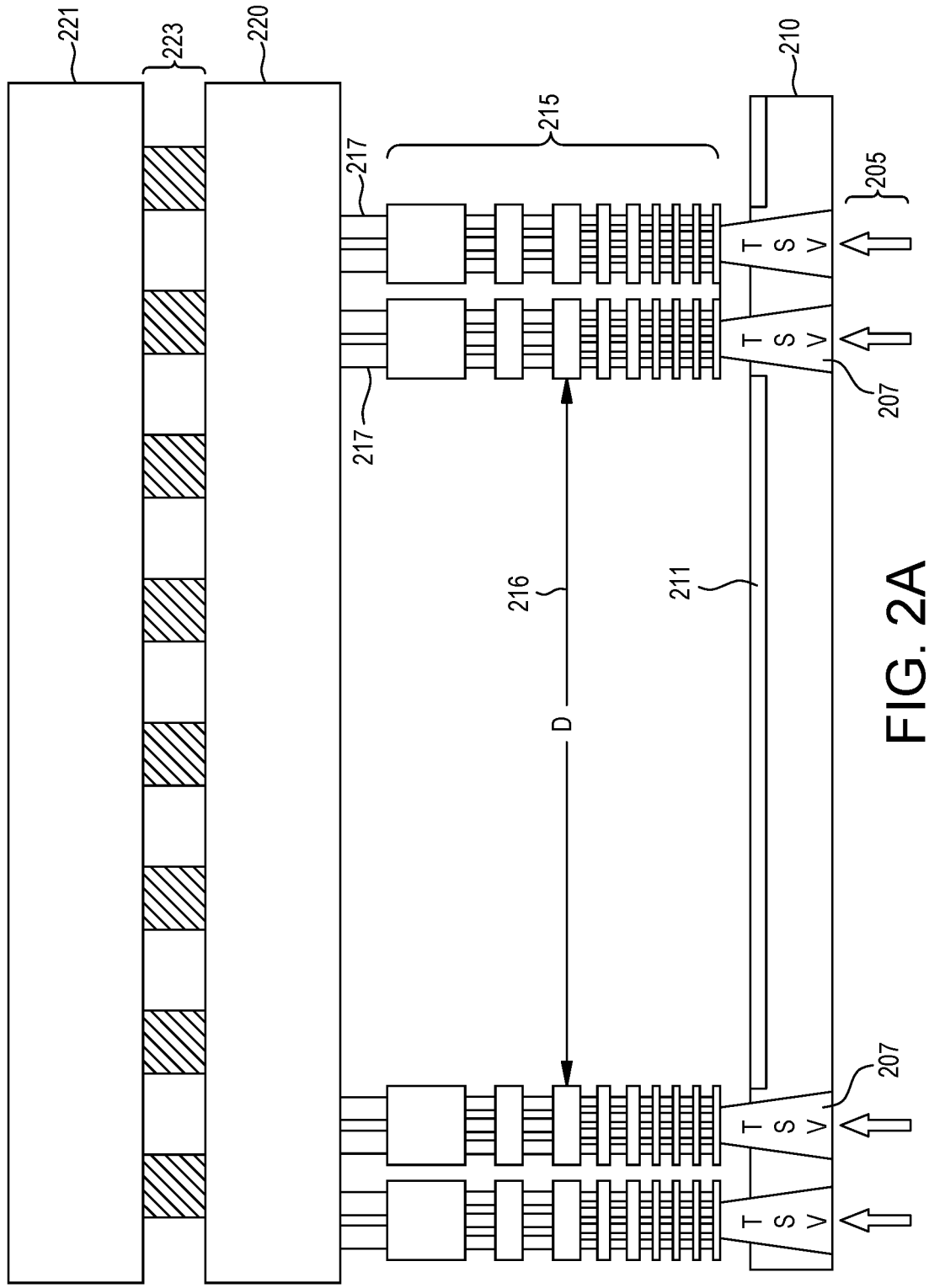
FIG. 2A illustrates a bottom portion of an example stacked die configuration, according to some examples.

FIGS. 2A through 2D, next described, illustrate details of an example stacked IC device, having four separate dies. The stacked IC device is similar to that illustrated in FIG. 1, but with an additional die, and greater detail is provided. Because the detailed drawings of the example stacked IC device at an easy to view size could not easily fit into one figure, four separate figures are used to present the example die. Beginning with reference to FIG. 2A, a bottom die of the example device is shown. It begins with bottom substrate 210, and ends at top metal layer 220. Provided on bottom substrate 210 are transistors 211. Bottom substrate 210 is thinned, to accommodate power TSVs 207. As shown by the arrows 205, current enters the example device through TSVs 207, which, for example, may be connected to C4 bumps (not shown) provided underneath bottom substrate 210, as was illustrated in FIG. 1. Distance D 216 illustrates the distance between power TSV regions. It is noted that, in one example, distance D is hundreds of times larger than the TSV size (i.e., width or pitch) itself. Thus, the relative dimensions of distance D 216 and the shown width of TSVs 207, both as shown in FIG. 2A are not to scale, for ease of illustration. Between power TSVs 207 and first top metal layer 220 are provided a plurality of intermediate metal layers at varying thicknesses 215, each intermediate metal layer parallel to bottom substrate 210. Through the intermediate metal layers 214 CSVs 217 pass, which connect power TSVs 207 with first top metal layer 220. CSVs 217 are thus part of a global power mesh that delivers power from its entry at 205 to all four of the dies of the device.

Figure 2B:
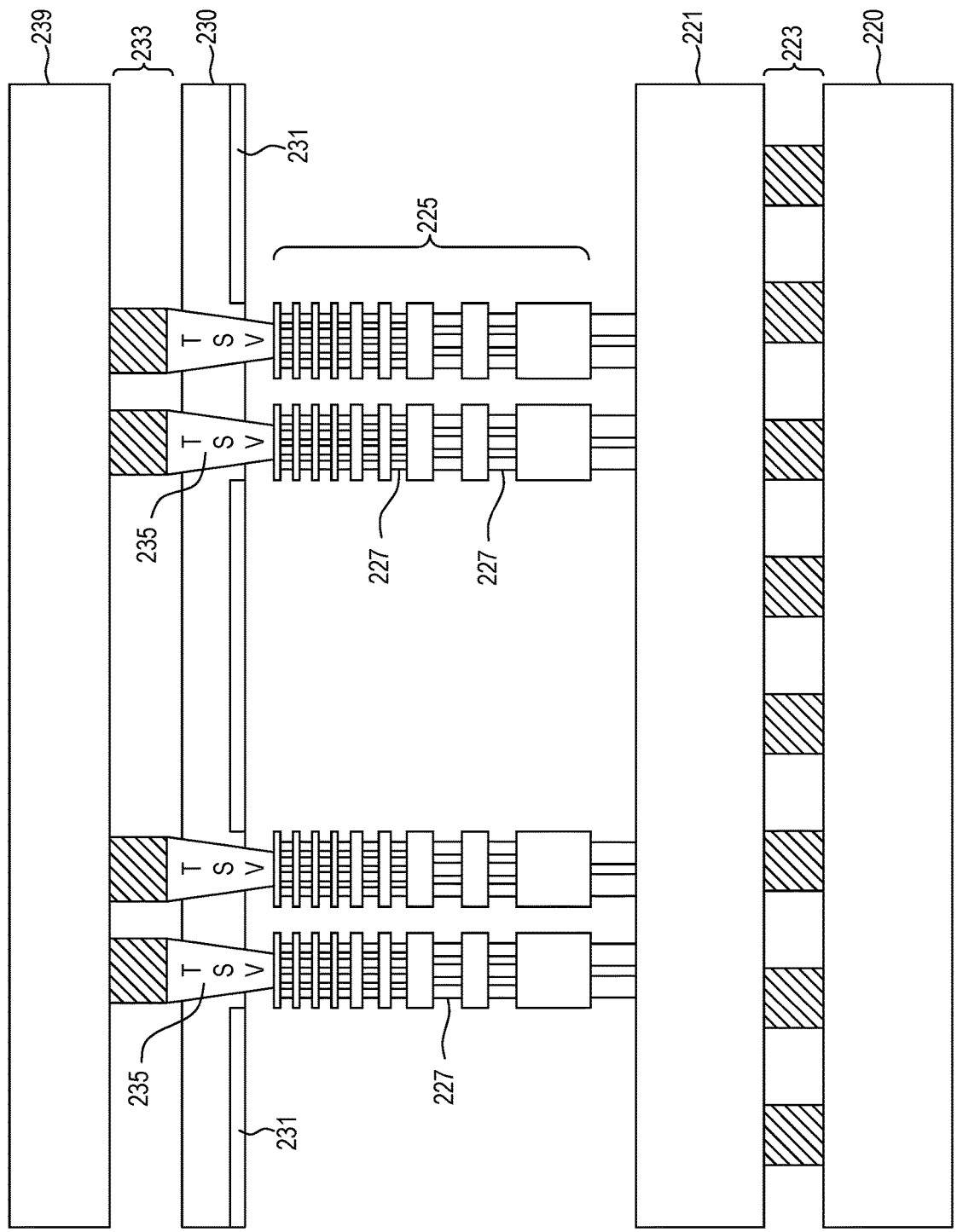
FIG. 2B illustrates a first middle portion of the example stacked die configuration of FIG. 2A, according to some examples.

As was the case in the example of FIG. 1, the bottom die is not necessarily aligned with the second die provided above it, as shown in FIG. 2B. Thus, in the example of FIGS. 2A-2D, top metal layer 220 of the bottom die creates a low resistance mesh, to minimize resistance due to misalignment between the bottom die and the die above it. Top metal layer 220 of the bottom die is die-to-die bonded to top metal layer 221 of the first intermediate die. As is readily seen in FIGS. 2A and 2B, the intermediate die is stacked on the bottom die in a face to face manner, where the respective top metal layers are connected, and thus the substrate of the first intermediate die lies above the various metal layers of the first intermediate die. The two top metal layers 220 and 221 are connected by a set of connections 223 so that any X/Y lateral current flow has many parallel paths to flow through. The die to die bonding layer between top metal layer 220 and top metal layer 221 utilizes heterogeneous stacking, where the two dies involved are different and their power chimneys are not aligned.

FIG. 2B illustrates a first intermediate die, which begins with top metal layer 221 and ends at substrate 230. Substrate 230 is also a thinned silicon wafer, and thus able to accommodate fine pitch power TSVs 235 that cross through it. It is noted that the terms "begin" and "end" as used in this description refer to vertical position, where a structure or sub-structure begins at a lower level, and ends at a higher level. For context, at the bottom of FIG. 2B there is also shown top metal layer 220 of the bottom die, and the set of connections 223 by which it is bonded to top metal layer 221 of the first intermediate die.

Between top metal layer 221 and substrate 230 are provided a plurality of intermediate metal layers 225 at varying thicknesses, each intermediate metal layer parallel to the top metal layer 221. Through the various intermediate metal layers 225 pass CSVs 217, which are, as noted above, vertical conduits that connect top metal layer 221 with power TSVs 235 that are provided within first intermediate die's substrate 230. Thus, CSVs 227 and power TSVs 235 are also part of the global power mesh of the device. At the top of FIG. 2B is shown the top metal layer 239 of the next die, the second intermediate die, which is shown in detail in FIG. 2C, next described. Top metal layer 239 of the second intermediate die is bonded to substrate 230 of the first intermediate die via connections 233. Thus, second intermediate die is stacked onto first intermediate die in a face to back orientation. What is noteworthy here is that the second intermediate die is stacked onto the first intermediate die using homogenous stacking, where both dies are identical and their power chimneys are aligned. Thus, connections 233 are aligned with both TSVs 235 below, and with CSVs 237 above, as shown in FIG. 2C.

Figure 2C:
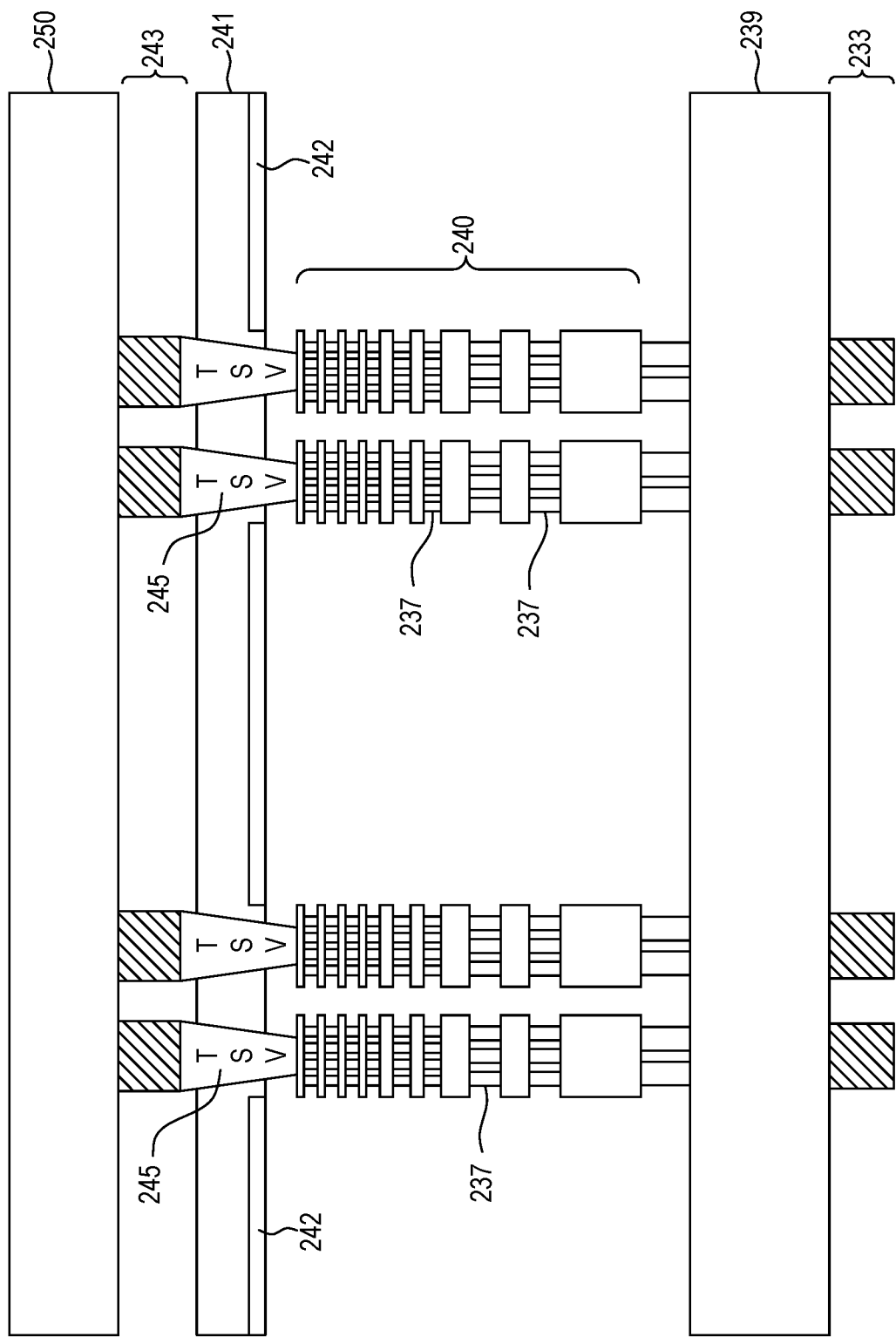
FIG. 2C illustrates a second middle portion of the example stacked die configuration of FIG. 2B, according to some examples.

FIG. 2C illustrates a second intermediate die (and the third die overall) of the example stacked IC device, according to some examples. With reference to FIG. 2C, the second intermediate die begins with top metal layer 239 and ends at substrate 241. Connections 233, as shown in FIG. 2B are also shown in FIG. 2C, for context, and to show how they align with the power mesh of the second intermediate die. Substrate 241 is also a thinned silicon wafer, and thus able to accommodate fine pitch power TSVs 245 that cross it. As in the case of the previous dies, there are transistors 242 provided on the upper surface of substrate 241. Between top metal layer 239 and substrate 241 are provided a plurality of intermediate metal layers 240 at varying thicknesses, each intermediate metal layer parallel to the top metal layer 239. Through the various intermediate metal layers 240 pass CSVs 237, which are vertical conduits that connect top metal layer 239 with power TSVs 245 that are provided within substrate 241 of the second intermediate die. Thus, CSVs 227 are also part of the global power mesh of the device.

Figure 2D:
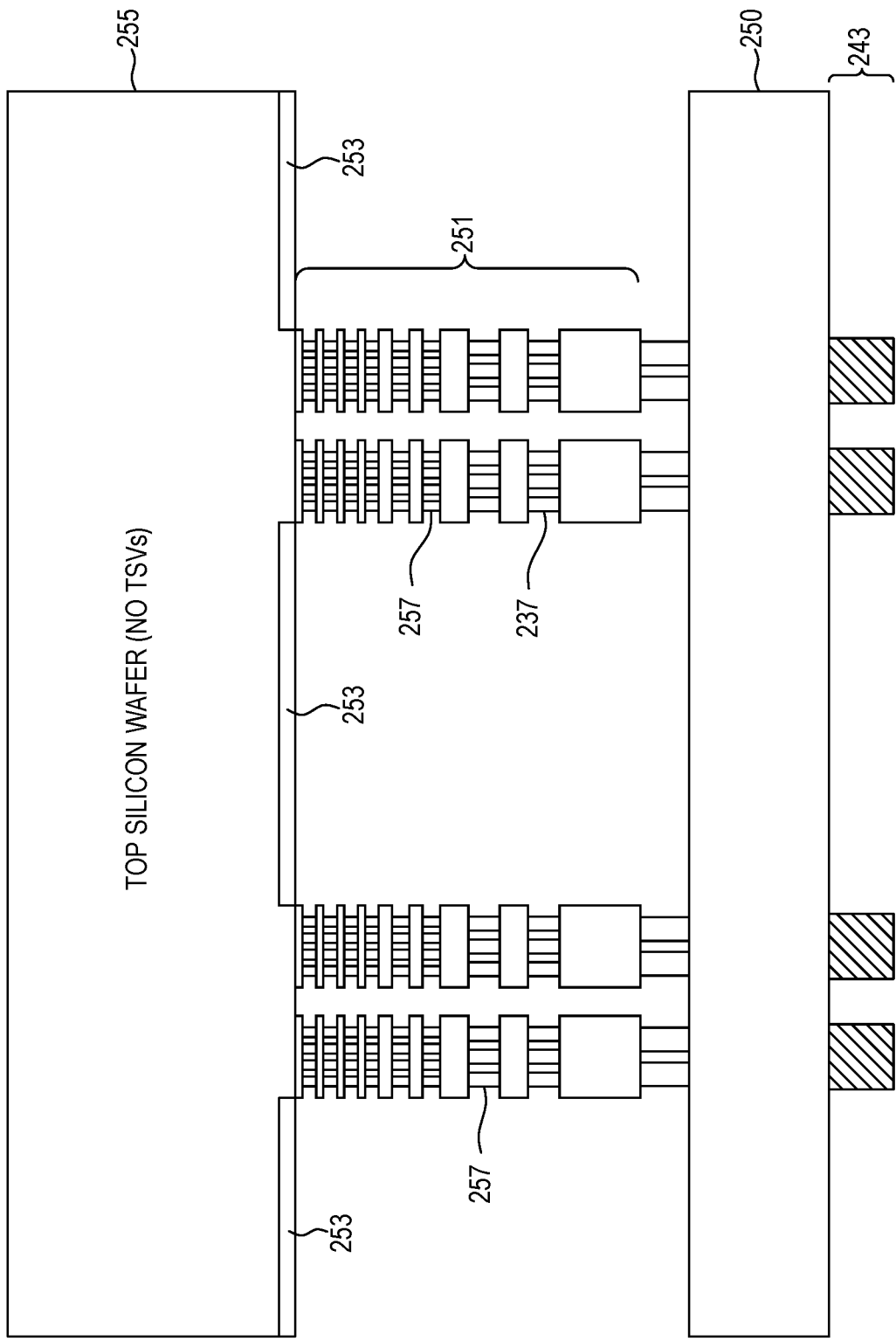
FIG. 2D illustrates a top portion of an example stacked die configuration, according to some examples.

At the top of FIG. 2C is shown the top metal layer 250 of the next die, the top die, which is shown in detail in FIG. 2D, next described. Top metal layer 250 of the top die is bonded to substrate 241 of the second intermediate die via connections 243 that align with and connect to TSVs 245. Thus, the top die is stacked onto the second intermediate die in a face to back orientation. The die to die bond (also known as a "hybrid bond") here also uses homogenous stacking, where both dies are identical and their power chimneys are aligned. Thus, connections 243 are aligned with both power TSVs 245 below (themselves aligned with CSVs 245 of the second intermediate die), and with CSVs 257 above, as shown in FIG. 2D.

FIG. 2D illustrates a top and final die (being the fourth die overall) of the example stacked die configuration, according to some examples. With reference to FIG. 2D, the top die begins with top metal layer 250 and ends at substrate 255. Substrate 255, being the uppermost substrate, is not thinned, as it has no TSVs. Connections 243, as shown in FIG. 2C are also shown in FIG. 2D, for context, and to show how they also align with the power mesh of the top die. Substrate 255 is not a thinned wafer, as there is no need to provide TSVs through it. As in the case of the previous dies, there are transistors 253 provided on the upper surface of substrate 255. Between top metal layer 250 and top substrate 255 are provided a plurality of intermediate metal layers 251 at varying thicknesses, each intermediate metal layer parallel to the top metal layer 250. Through the various intermediate metal layers 251 pass CSVs 257, which are vertical conduits that connect top metal layer 250 with top substrate 255. Thus, CSVs 257 are the last link in the global power mesh of the device. The example device of FIGS. 2A through 2D ends at top die substrate 255, which is the top portion of its fourth and final die.

Figure 3:
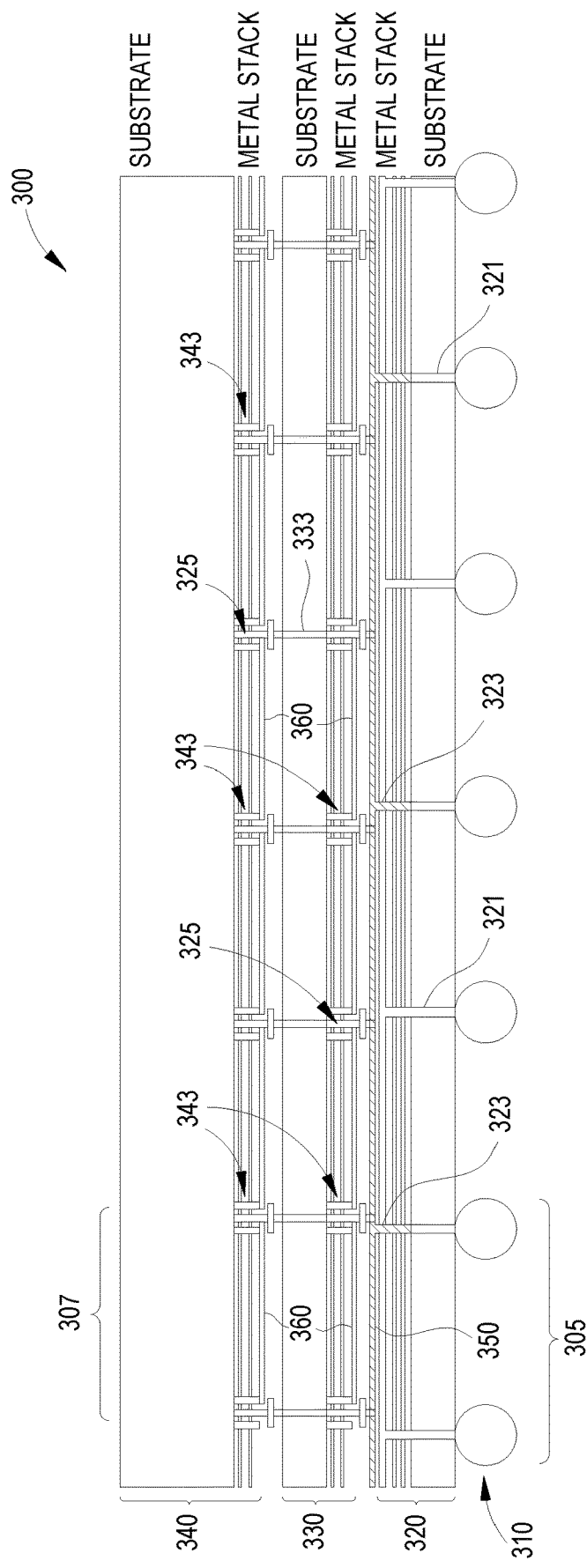
FIG. 3 illustrates an example misalignment between input/output and fabric die power TSVs.

FIG. 3 illustrates an example misalignment between IO and fabric dice to accommodate different block sizes in an example stacked IC device 300. It is noted that elements of the example stacked IC device of FIG. 3 that have already been described with reference to FIGS. 1 and 2A-2D are identified, but not described yet again in detail. With reference to FIG. 3, IC device 300 has a three die structure, with a bottom IO die 320 and two upper fabric dies 330 and 340. Bottom IO die 320 is connected to C4 bumps 310, through which, in one example, current enters the IC device, as described above. IO die 320 includes a substrate and several layers of metal, known as a "metal stack." Within the substrate of IO die 320 are provided power TSVs 321, and, as shown and described above, through the metal stack of IO die 320 are provided CSVs 323.

Provided on top of IO die 320 are two fabric dies, die 330 and die 340, respectively. These are stacked on top of IO die in a face to back configuration, as was the case in each of the devices of FIG. 1 and FIGS. 2A through 2D. Thus, each of fabric dies 330 and 340 have their metal stack beneath their substrates in this configuration. As shown in FIG. 3, the IO die has a different pitch for its TSVs 321 and for the CSVs 323 of its metal stack than the pitch used in the two fabric dies for their respective TSVs 333 and metal stack CSVs 325. Bottom IO die 320 has an example C4 pitch of between 130-140 microns, for example, and, as noted above, this is also used for TSVs 321 and CSVs 323 for alignment of the power conduits in IO die 320. However, the pitch used for the fabric power TSVs 333, which is identical to the pitch for the fabric die CSVs 325, is approximately 120 microns. The upper die does not have any TSVs, as described above. Thus, as shown, there is a significant difference in thicknesses between top fabric die 340 and intermediate fabric die 330. In one example, fabric die 340 is 700 microns thick, whereas fabric die 330 is 2.5 microns thick.

Continuing with reference to FIG. 3, the two differing pitch regimes both connect to power mesh 350, provided between the metal stack of IO die 320 and the metal stack of middle fabric die 330. As described above, this is an example of heterogeneous stacking, and power mesh 350, in one example, mitigates any IR drop across it due to the differences in pitch by providing a plurality of paths for current to flow between the two top metal layers. This is shown in FIG. 3 by the synonymous term "hybrid bond."

FIG. 3 also illustrates local power distribution at each individual fabric die, which is elaborated on in each of FIGS. 4A, 4B and 5, described below. As shown in FIG. 3, while the aligned TSVs and CSVs of each fabric die carry power globally, in order to obtain power at a local individual fabric die, the global power conduit mesh must be first connected to a power gate (not shown) provided on the active surface of that fabric die's substrate, and from there a local conduit conveys the local power up through the various metal layers of that die's metal stack. To implement this, local conduits 343 connect the active layer to the various metal layers in the metal stack, so as to power transistors on each of the metal layers, as shown. In the example of FIG. 3, as shown, local conduits 343 connect the active layer of each of fabric dies 330 and 340 to their respective top metal layers 360 of each fabric die. In alternate examples all intermediate metal layers of each fabric die may be connected to the local power mesh. However, because these intermediate layers are usually higher resistance layers than the top metal layer of the fabric die, most of the current is likely to be supplied by the top metal layer itself, which is why in the depicted example, local conduits 343 connect directly to the top metal layers of each fabric die. This functionality is illustrated in detail in FIGS. 4A and 4B, next described.

Figure 4A:
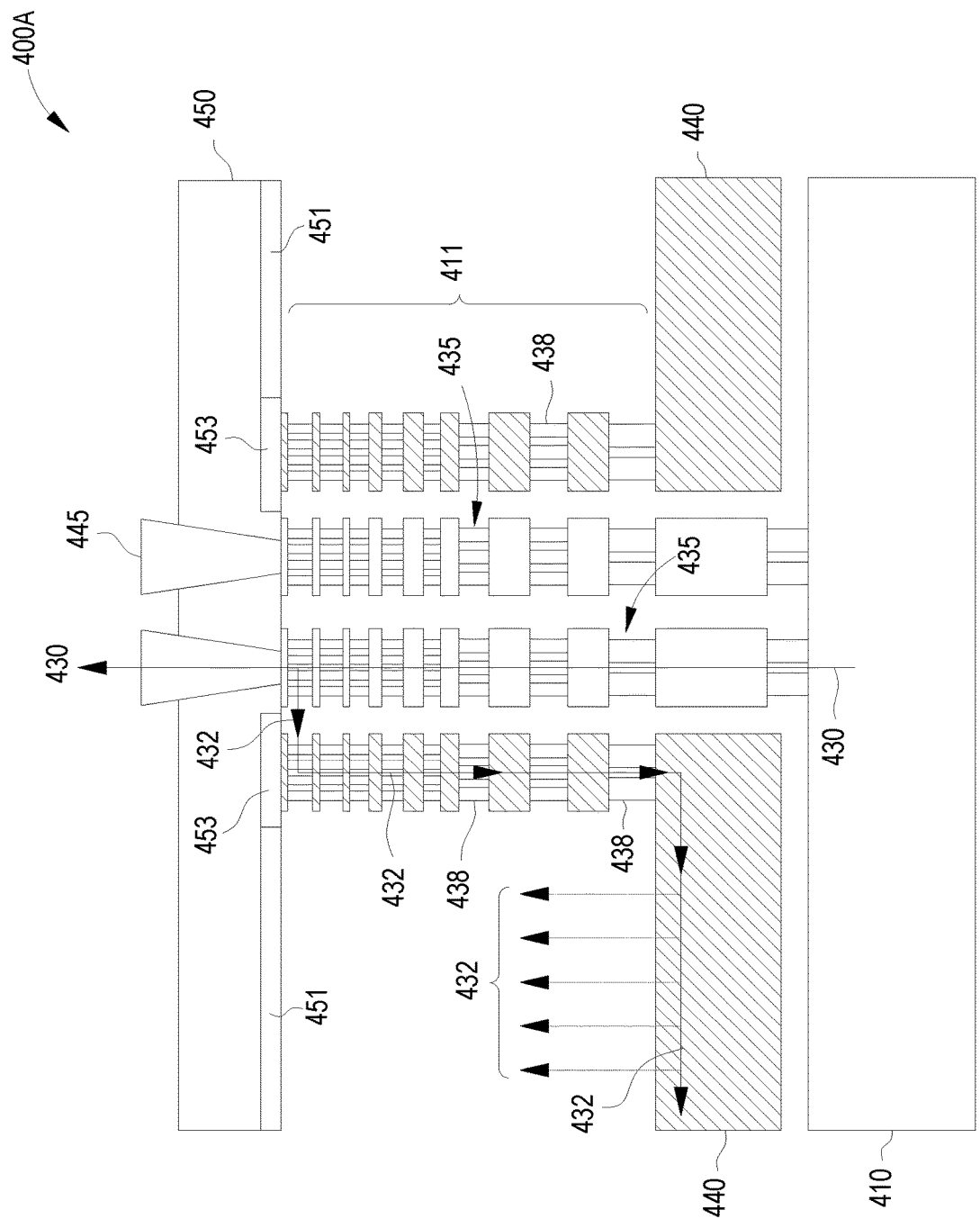
FIG. 4A illustrates power gates and a local chimney structure in a first example scenario where current enters from a top metal layer of a die (bottom of the figure) and exits through TSVs of a substrate of the die, according to some examples.

FIG. 4A illustrates power gates and a local chimney structure in a first example scenario where current enters from a top metal layer of the die (shown at the bottom of the figure) and exits through TSVs of a substrate of the die, according to some examples. With reference to FIG. 4A, there is shown an example die 400A. The die 400A is in the upside down configuration, and thus a global current 430 enters the die from the top metal layer 410 shown at the bottom of the figure. The die may be, for example, one of the intermediate dies shown in FIGS. 2B and 2C, described above, which are oriented in this same orientation. The example die 400A has several metal layers 411 provided between the top metal layer 410 and a substrate 450, and two types of CSVs 435,438 that pass through each of the metal layers 411. CSVs 435 carry global current 430 from the top metal layer 410 to substrate 450. A portion of the global current 430 continues upward through substrate 450 to the remainder of the die stack, passing through TSVs 445 to the next higher die. However, another portion of global current 430, namely local current 432 shown by a dashed line, proceeds through power gates 453, provided on the top surface of substrate 450, and from there enters one of the second type of CSVs 438, which delivers what is now local current 432 to transistors of the die. As shown, local current 432 first travels back down through the metal layers 411, towards top metal layer 410, from which it is delivered to local power mesh 440.

In examples, this local current 432's route back down to metal layer 410 is for the following reasons. In examples, the local region may often be large, on the order, for example, of hundreds of microns. Thus, for the local power mesh to service such a large area, it needs the thickest available layer, which thus has the lowest resistance, for it. This is generally the top metal layer. Thus, in such examples, the local power mesh for a die is created using the top metal layer of the die, from whence current travels down to the transistors via all of the metal layers 411. Alternatively, in other examples, it is possible to create a local power mesh at an intermediate metal layer. While this alternative does reduce the number of metals to cross before reaching the transistors, such a local power mesh would itself have a high resistance. As a result, the IR drop to the transistors may be in fact worse than that coming from a top metal layer.

FIG. 4B illustrates power gates and a local chimney structure in a second example scenario where global current enters from a TSV of the substrate of a die 400B and exits through a top metal layer 410 of the die, according to some examples. The example of FIG. 4B is equivalent to that of FIG. 4A, with the difference that the die configuration 400B of FIG. 4B is used when current enters the die from the TSV side, such as, for example, when die 400B is the base die in a die stack, and where, for example, the global current 430 enters TSVs 445 from C4 bumps, as shown in FIG. 1, for example, and described above. In contrast, the example of FIG. 4B is rotated 180 degrees about an axis coming out of the figure relative to the example of FIG. 4A, so that in each figure, global current 430 enters the example die at the bottom of the figure.

Because the various structures of the example die 400B were described above in connection with the die 400A configuration of FIG. 4A, those same structures will not be described again here. However, the variant aspects of the die configuration 400B of FIG. 4B, that are not present in the die configuration 400A of FIG. 4A, are next described. Because in the case of die 400B of FIG. 4B global current enters from TSVs 445 (as shown, at the bottom of FIG. 4B), and because local power CSVs 438 are accessed from the top surface of substrate 450, via power gates 453, there is no need for global current 430 to travel all the way up global power CSVs 435 to top metal layer 410. Thus, a portion of global current 430, upon exiting TSVs 445 (originating at a lower die in the stack), proceeds directly to power gates 453, and from there, now having become local current 432, directly enters local power CSVs 438 and travels up to top metal layer 410, but now through local CSVs 438. From the top metal layer 410, local current 432 is then delivered to local power mesh 440, and thus delivered to transistors in various layers by travelling through various metal layers below the top metal layer 410 as described above with reference to FIG. 4A. Thus, in both of the example scenarios of FIGS. 4A and 4B, once a portion of global current 430 breaks off to become local current 432, by crossing through power gates 453, local current 432 then travels form the surface of the substrate 450 all the way back down, or up, as the case may be, to the top metal layer before being provided to transistors in the lower layers.

Figure 5A:
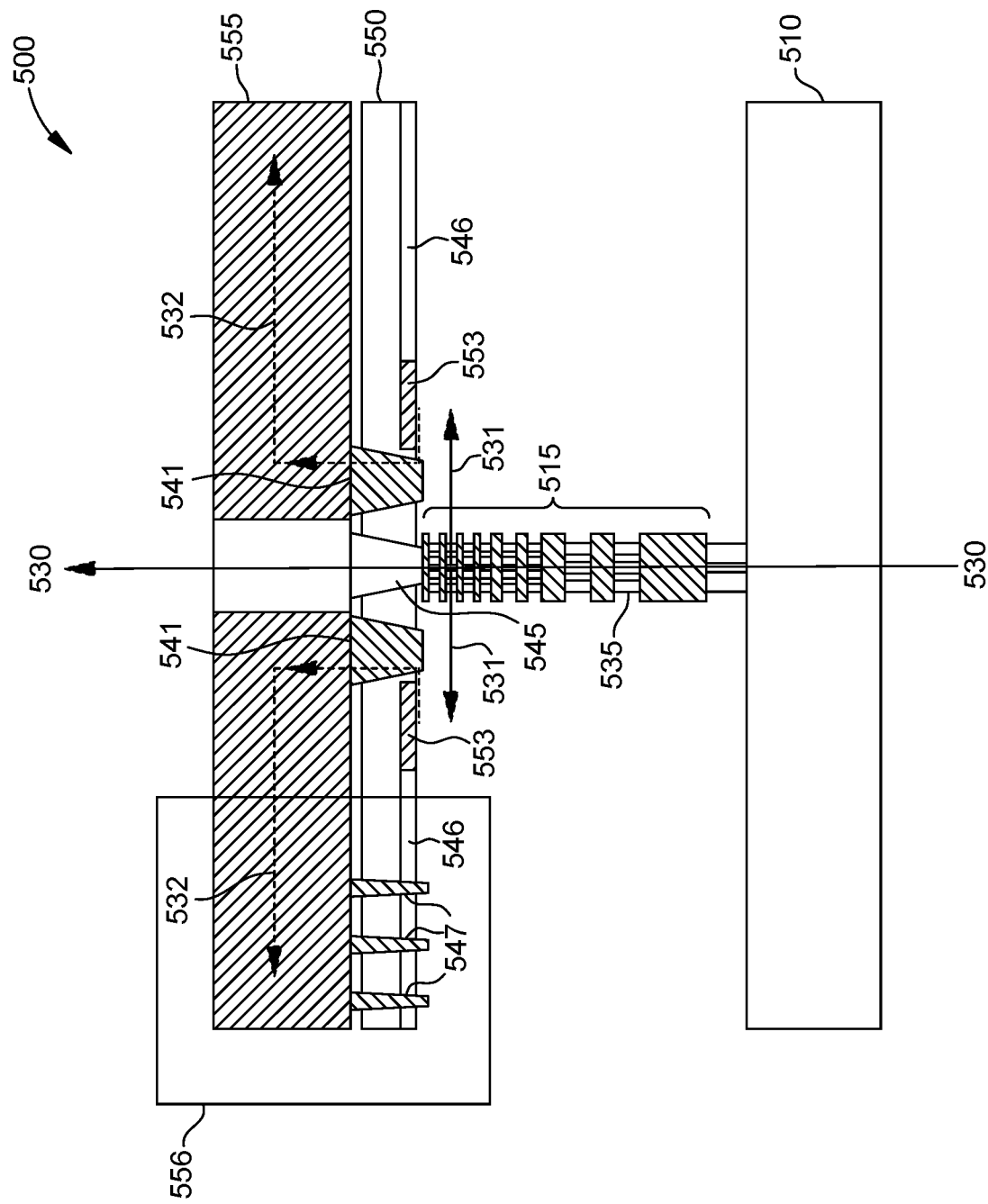
FIG. 5A is a variation of the example of FIG. 4A, where instead of a local chimney structure, power is delivered to transistors of the die through one or more backside metal layers to local power grids, according to some examples.

FIG. 5A illustrates an example die 500, which may be, for example, a fabric die, oriented "upside down" in the same manner as is die 400A of FIG. 4A. In fact, die 500 is a variation of the example die 400A of FIG. 4A, where global current enters a top metal layer of the die, at the bottom of the figure, and travels to the substrate at the top of the figure. However, in the example of FIG. 5A, instead of a local chimney power mesh structure, power is delivered to transistors of the die through one or more backside metal layers to local power grids, according to some examples.

With reference to FIG. 5A, global current 530 enters the example die 500 through top metal layer 510, shown at the bottom of FIG. 5A. From there global current 530 travels up through global CSVs 535 (there are no local CSVs in this example) to TSV 545 on the top surface of substrate 550. Substrate 550 is a thinned silicon substrate, so as to accommodate several TSVs, as next described. A portion of global current 530 continues through TSV 545 up to higher dies of the die stack, through backside metal layers 555, as shown. TSV 545 is the same type of TSV described above, and is aligned with global CSVs 535, as described above, to minimize IR drop. However, another portion of global current 530, illustrated as arrows 531, instead of entering TSV 545, crosses into power gates 553 that are provided on the top surface of substrate 550. In one example, the current path 531 for the local current runs along a metal 1 or metal 2, e.g., a first (in the sense of closest to the substrate 550) metal layer or a second (in the sense of next closest to the substrate 550) metal layer of metal layers 515.

Continuing with reference to FIG. 5A, from power gates 553, the portion of global current illustrated as arrows 531 now becomes local current 532. It proceeds from power gates 553 through additional local current TSVs 541, which are unique to this backside power example, into one or more backside metal layers 555. It is noted that the reason for putting all three TSVs together as shown in the example of FIG. 5A, and thus "global current" TSV 545 is placed in between local current TSVs 541, with the power gates 553 on the outer side of each local current TSV 541, is due to the fact that there is generally a "keep-out" zone around a TSV where no circuits are allowed. So, if the power gates 553 were to be placed in between two TSVs, e.g., between each local TSV 541 and central global TSV 545, and thus on either side of central global TSV 545, some area would be wasted. In other examples the power gates 553 may be placed between two TSVs, which has the benefit of making the current path 531 between central global TSV 545 and local current TSVs 541 easier to route in metal (avoiding the backtrack as shown in FIG. 5A, where the global current 531 passes over a local current TSV 541, then enters a power gate 553, exits as local current 532, and then changes direction and travels back to the local current TSV 541, and then enters the local current TSV 541). From local current TSVs 541, local current 532 then flows through backside metal layers 555, as shown, and re-enters the active circuitry 546 on the top side of substrate 550 through finer pitch local TSVs 547, as shown.

In one example, finer pitch TSVs 547 connect backside metal layers 555 to transistor wells of local power grids, which negates any need to connect to any metal layer on the front side. However, in other examples, where well connectivity may not be allowed from a process standpoint, then, in such other examples, the backside metals may be connected to the metal grid in M2 (e.g., the second metal layer of metal layers 515). M2 is usually used in standard cell layouts for a power grid. It is here noted that if it is necessary or desired to go all the way back to top metal layers, there may not be significant benefit to using the backside power delivery approach of FIG. 5. In this manner, the example of FIG. 5 obviates the need for local CSVs, as shown in FIGS. 4A and 4B, thus minimizing disruption of the die.

Figure 5B:
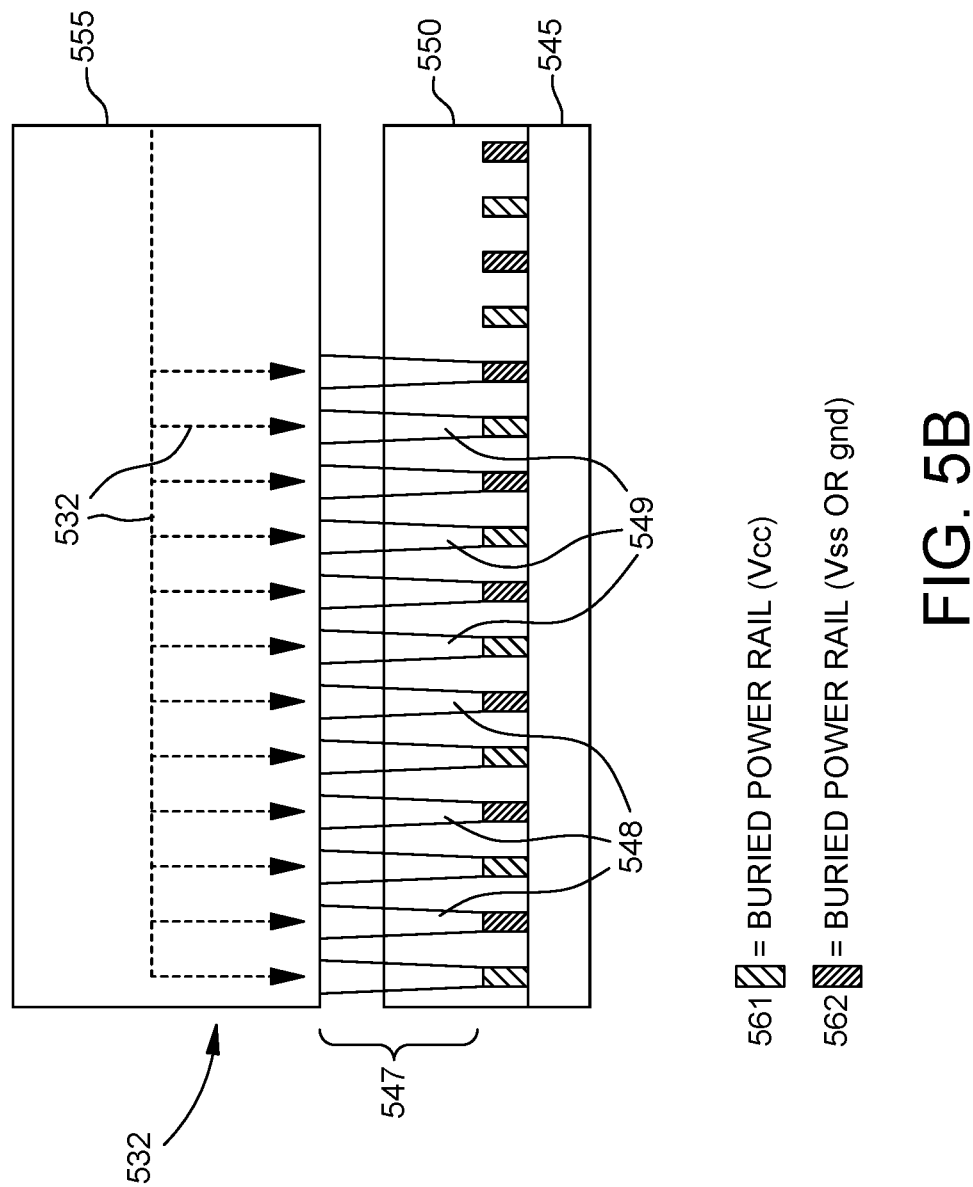
FIG. 5B is a variation of the example of FIG. 5B, illustrating delivery of power from backside metal layers to buried power conduits, according to some examples.

FIG. 5B illustrates an alternate method of power delivery that relies on buried power rails, e.g., power rails that are buried in a silicon substrate of a die that tap into the transistor sources/drains from the underside. As was the case for the example shown in FIG. 5A, described above, in the alternate method of FIG. 5B several backside metal layers are provided that act as a base die power mesh. From there, finer pitch TSVs, e.g., finer pitch TSVs 547, connect to buried power rails 561, for Vcc, and 562 for Vss or ground, in the base die substrate, and deliver power entirely from the back side of the substrate, leaving the metal layers on the front side of the substrate to be used only for signal transmission, thus packing more signals per layer. Thus, FIG. 5B is a magnified view of box 556 shown in FIG. 5A. Thus, FIG. 5B shows many of the structures also shown in the example of FIG. 5A, and these need not be described again. The additional detail provided by FIG. 5B is next described.

With reference to FIG. 5B, as also shown in FIG. 5A, local current 532 travels through the backside metal layers to local finer pitch TSVs 547. Local finer pitch TSVs 547 are respectively connected to two buried power rails, 561 which carries Vcc, and 562 which carries Vss or ground. To allow easy identification of these connections, buried power rails 561 are shown with large pitch diagonal shading, and the local finer pitch TSVs that connect to them are labeled 549, and buried power rails 562 are shown with finer pitch diagonal shading, and the local finer pitch TSVs that connect to them are labeled 548, as shown.

In examples such as is shown in FIGS. 5A and 5B, the backside metals create a low resistance power mesh on the base die.

Moreover, using backside metals has the advantage of being able to use higher-K dielectrics to increase power/ground capacitance without hurting signal performance, which would use lower-K dielectrics on the top side of the die. Since the power mesh is on the back side of the bottom die the IR drop on the bottom die is thus lower because current need not travel all the way to the top metal layer and then back down again to the base die circuits, as is required in the example of FIG. 4A. Similarly, using global CSVs, as described above, helps to create a low resistance path for power delivery from the bottom die to each of the dies above it. Once the power lands on the backside of each die in the stack, it can proceed through the backside metals down to the transistors, in the same manner as is done on the bottom die as is illustrated in FIGS. 5A and 5B, described above.

In an alternate example, the front side metals of the next die along the stack may be used to connect directly to the fine back-side TSVs that directly connect to power rail. In this alternate methodology, there is no need to have backside metals on the die. However, it is noted that one disadvantage of this approach is that having backside metals specifically for the purpose of power delivery allows usage of high-K dielectric materials to maximize capacitance, something that front side metals try to avoid due to a performance penalty associated with higher capacitance.

Figure 6:
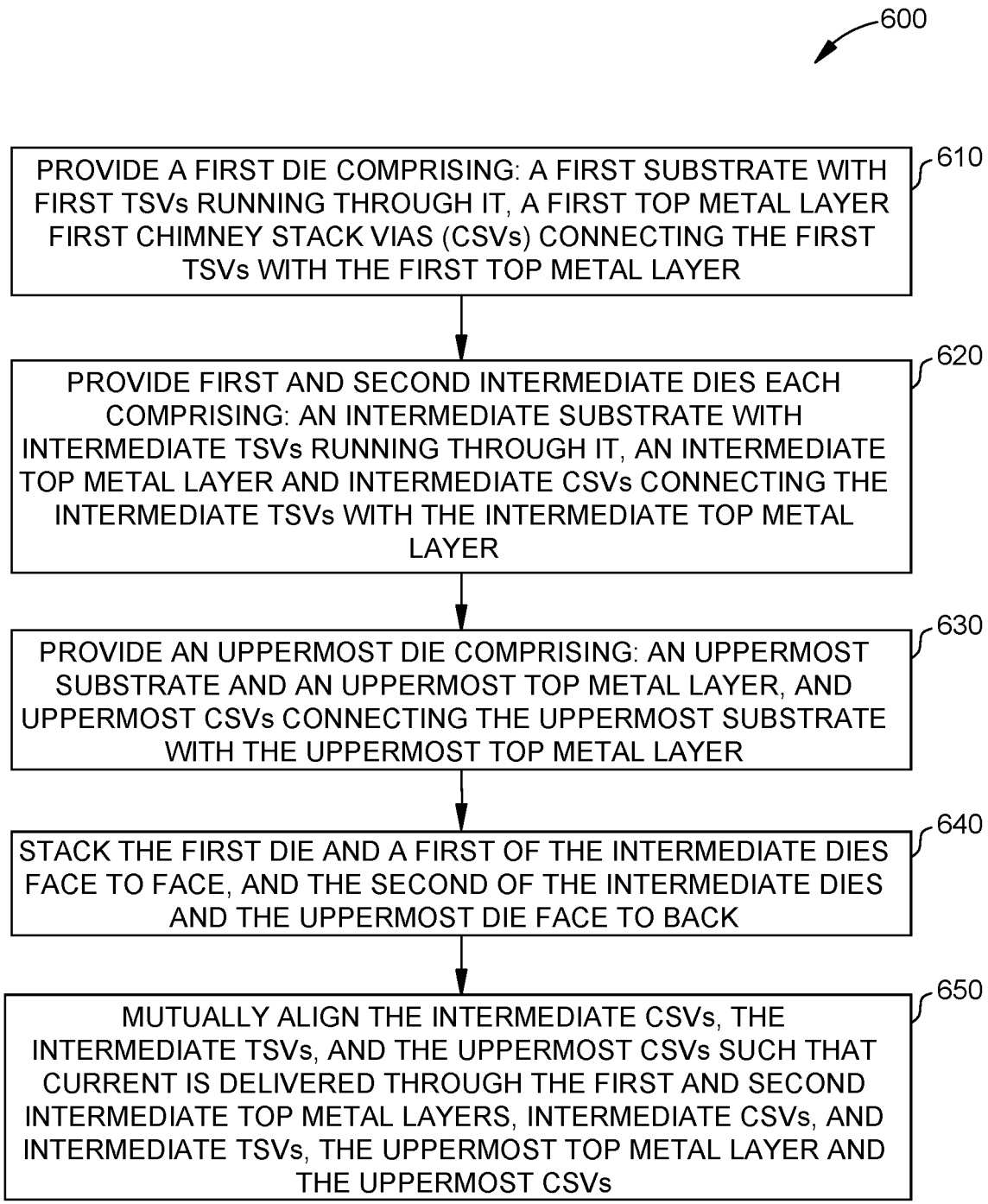
FIG. 6 is a flow diagram of a method for providing power delivery to an AoA stack, according to some examples.

FIG. 6 is a flow diagram of a method 600 for providing power delivery to an AoA stack, according to some examples. The method 600 is described below in the context of the example devices shown in FIGS. 1, 2A through 2D and 3. Other examples can be implemented using other stacked IC devices.

Method 600 begins at block 610 where, a first die is provided comprising a first substrate with first TSVs running through it, a first top metal face and first chimney stack vias (CSVs) connecting the first TSVs with the first top metal face. For example, the first die may be that shown in FIG. 2A and described above.

From block 610, method 600 proceeds to block 620, where first and second intermediate dies are provided, the intermediate dies each comprising an intermediate substrate with intermediate TSVs running through it, an intermediate top metal face and intermediate CSVs connecting the intermediate TSVs with the intermediate top metal face. For example, the first intermediate die may be that shown in FIG. 2B, and the second intermediate die may be that shown in FIG. 2C, each as described above. In some examples all of the intermediate dies may be substantially identical.

From block 620, method 600 proceeds to block 630, where an uppermost die is provided, the uppermost die comprising an uppermost substrate and an uppermost top metal face, and uppermost CSVs connecting the uppermost substrate with the uppermost top metal face. For example, the uppermost die may be that shown in FIG. 2D, with a non-thinned substrate 255, as described above.

From block 630, method 600 proceeds to block 640, where the first die and a first of the intermediate dies are stacked face to face, and the second of the intermediate dies and the uppermost die are successively stacked face to back on the stacked IC device. An example of this stacking is illustrated in FIGS. 2A-2D, where, as shown in FIGS. 2A and 2B, the top metal layer 220 (the "face") of the bottom die is bonded with the top metal layer 221 (the "face") of the first intermediate die, and these two dies are thus stacked face to face, and, as shown in FIGS. 2B and 2C, where the top metal layer 239 (the "face") of the second intermediate die is bonded to the back side of substrate 230 of the first intermediate die. As regards the third and fourth dies of the stacked device, the back to back stacking is shown in FIG. 2C, where the top metal layer 250 (the "face") of the top die is bonded to the back side of substrate 241 of the second intermediate die.

From block 640, method 600 proceeds to block 650, where the intermediate CSVs, the intermediate TSVs, and the uppermost CSVs are all mutually aligned such that current is delivered through the first and second intermediate top metal layers, the intermediate CSVs, the intermediate TSVs, the uppermost top metal layer and the uppermost CSVs. Method 600 terminates at block 650.

Figure 7:
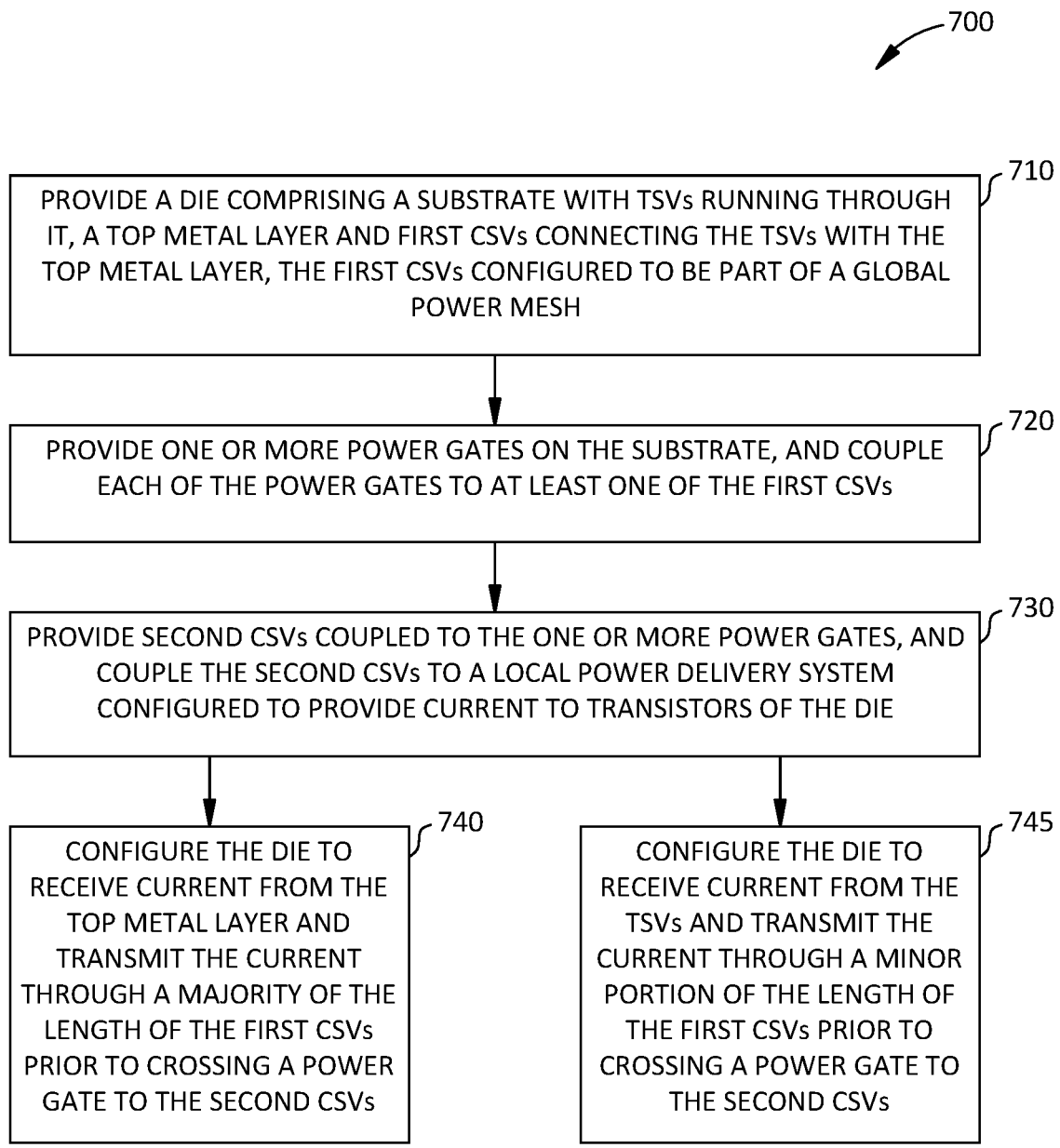
FIG. 7 is a flow diagram of a method for providing local power to an individual die of an AoA stack, according to some examples.

FIG. 7 is a flow diagram of a method for providing a local power mesh for an individual die of an AoA stack, according to some examples. The method 700 is described below in the context of the example devices shown in FIGS. 4A, 4B and 5. Other examples can be implemented using other stacked IC devices.

Method 700 begins at block 710 where, a die is provided comprising a substrate with TSVs running through it, a top metal layer and first CSVs connecting the TSVs with the top metal layer, the first CSVs configured to be part of a global power mesh. For example, the die may be that shown in either FIG. 4A, FIG. 4B or FIG. 5, as described above.

From block 710, method 700 proceeds to block 720, where one or more power gates are provided on the substrate, and each of the power gates is coupled to at least one of the first CSVs. For example, as shown in FIGS. 4A and 4B, substrate 450 is provided with power gates 453, each of which is coupled to one or more of CSVs 435, as shown, such that global current 430 (solid lines) crosses power gates 453 and becomes local current 432 (dashed lines).

From block 720, method 700 proceeds to block 730, where second CSVs are provided, coupled to the one or more power gates, and the second CSVs are coupled to a local power delivery system configured to provide current to transistors of the die.

From block 730, method 700 bifurcates into two possible flow paths, respectively proceeding to blocks 740 or 745. Block 740 is first described, where the die is configured to receive current from the top metal layer of the die and transmit the current through a majority of the length of the first CSVs prior to crossing a power gate to the second CSVs. For example, this is shown in FIG. 4A, where, due to the fact that global current 430 comes into the example die from the top metal layer 410, it passes along the entire length of CSVs 435, travelling to substrate 450, prior to crossing through power gates 453 to become local current 432. Method 700, in this branch, ends at block 740.

Alternatively, from block 730, method 700 may proceed to block 745, where the die is configured to receive current from the TSVs and transmit the current through a minor portion of the length of the first CSVs prior to crossing a power gate to the second CSVs. For example, this is shown in FIG. 4B, where, due to the fact that global current 430 comes into the example die from the TSV 445 side, it passes through power gates 453 immediately upon leaving TSVs 445, without having to travel through CSVs 437 to top metal layer 410. Once the current passes through power gates 453, it becomes local current 432 (dashed line). Method 700, in this alternate branch, ends at block 745.

It is noted that, in examples, Insertion of periodic C4/TSVs/CSVs to supply power through a base die to a power mesh above the base die serves to both minimally disrupt base die circuits as well as minimize IR drop.

Moreover, in examples, by stacking two vertically adjacent dies face to face, and thus providing via interfaces to connect a base die's power mesh to a next upper die's power mesh enables a base die, such as, for example, an IO die, and a next upper die, for example a first fabric die, to have different block sizes. In such examples, by aligning TSVs and CSVs between fabric die layers, a repeated IR drop between layers is minimized.

Finally, in examples, integration of backside buried power rails into 3D stacked devices minimizes an IR drop for each die along the die stack.

As used herein (including the claims that follow), a phrase referring to "at least one of" a list of items refers to any combination of those items, including single members. As an example, "at least one of: x, y, and z" is intended to cover x, y, z, x-y, x-z, y-z, x-y-z, and any combination thereof (e.g., x-y-y and x-x-y-z).

While the foregoing is directed to specific examples, other and further examples may be devised without departing from the basic scope thereof, and the scope thereof is determined by the claims that follow.

What is claimed is:
1. An apparatus, comprising:
  a first die comprising: a first substrate with first through silicon vias (TSVs) running through it, a first top metal layer and first chimney stack vias (CSVs) connecting the first TSVs with the first top metal layer;
  an uppermost die comprising: an uppermost substrate and an uppermost top metal layer, and uppermost CSVs connecting the uppermost substrate with the uppermost top metal layer,
  wherein the first and uppermost dies are stacked face to face, the first TSVs and the first CSVs are mutually aligned, and current is delivered to the apparatus from the first TSVs up through the first CSVs, the first and uppermost top metal layers, and the uppermost CSVs.
2. The apparatus of claim 1, further comprising one or more additional intermediate dies provided between the first die and the uppermost die, such that a bottom intermediate die is stacked face to face with the first die, and the uppermost die is stacked face to back with a top intermediate die, each intermediate die comprising:
  an intermediate substrate with intermediate TSVs running through it;
  an intermediate top metal layer and intermediate CSVs connecting the intermediate TSVs with the intermediate top metal layer,
  wherein the CSVs and TSVs of each intermediate die and the CSVs of the uppermost die are all mutually aligned.
3. The apparatus of claim 2, wherein the first top metal layer and the intermediate top metal layer are die to die bonded using multiple connections, configured to provide multiple current paths.
4. The apparatus of claim 2, wherein each of the first, intermediate and uppermost dies have one or more internal metal layers respectively provided between the first and intermediate substrates and each respective top metal layer, and wherein the CSVs of the die run through the one or more internal metal layers.
5. The apparatus of claim 4, further comprising one or more additional intermediate dies provided between the intermediate die and the uppermost die, each comprising a substrate with TSVs running through it, a top metal layer at a top of the die, and CSVs connecting the TSVs with the top metal layer.
6. The apparatus of claim 2, wherein at least one of:
  the first and intermediate dies are each thinner than the uppermost die; or
  the first and intermediate dies have the same thickness.
7. The apparatus of claim 2, wherein each of the first and intermediate dies further comprises:
  one or more power gates provided on the first and intermediate substrate, each coupled to at least one CSV; and
  a local chimney stack coupled to each power gate, the local chimney stack configured to deliver current to respective transistors of the die through a local power mesh.
8. The apparatus of claim 7, wherein, as to each of the first and intermediate dies, either:
  the die is configured such that current enters from the top metal layer, and flows through the CSVs to the power gate; or
  the die is configured such that current enters from TSVs of the substrate, and flows directly to the power gate.
9. The apparatus of claim 2 further comprising:
  C4 bumps disposed on a bottom surface of the first substrate, wherein the C4 bumps, the first TSVs, the first chimney stack vias, intermediate chimney stack vias, the intermediate TSVs, and the uppermost CSVs are all mutually aligned.
10. The apparatus of claim 1, further comprising a package substrate, provided under a bottom surface of the first substrate, and a set of C4 bumps provided between a top surface of the package substrate and the bottom surface of the first substrate, wherein the C4 bumps, the first TSVs and the first CSVs are mutually aligned.

11. The apparatus of claim 1, wherein the CSVs of each die are provided in an array with at least one of:
a predefined pitch, a predefined pitch in each of two dimensions, or a predefined pitch that is the same in each of the two dimensions.

12. A method, comprising:
providing a first die comprising: a first substrate with first TSVs running through it, a first top metal layer and first CSVs connecting the first TSVs with the first top metal layer;
providing an uppermost die comprising: a uppermost substrate and an uppermost top metal layer, and uppermost CSVs connecting the uppermost substrate with the uppermost top metal layer,
stacking the first uppermost dies face to face; and
aligning the first TSVs and the first CSVs and configuring the dies such that current is delivered from the first TSVs up through the first CSVs, the first and uppermost top metal layers, and the uppermost CSVs.

13. The method of claim 12, further comprising:
providing one or more additional intermediate dies between the first die and the uppermost die, such that a bottom intermediate die is stacked face to face with the first die, and the uppermost die is stacked face to back with a top intermediate die, each intermediate die comprising:
an intermediate substrate with intermediate TSVs running through it;
an intermediate top metal layer and intermediate CSVs connecting the intermediate TSVs with the intermediate top metal layer; and
mutually aligning the CSVs and TSVs of each intermediate die and the CSVs of the uppermost die.

14. The method of claim 13, wherein the first die is an IO die and the intermediate and uppermost dies are each fabric dies.

15. The method of claim 12, further comprising:
providing a package substrate under a bottom surface of the first substrate; and
providing a set of C4 bumps between a top surface of the package substrate and the bottom surface of the first substrate.

16. The method of claim 12, further comprising:
providing one or more power gates on the substrate, each power gate coupled to at least one CSV; and
providing, one or more local chimney stacks, respectively coupled to the one or more power gates, the local chimney stacks configured to deliver current to transistors of the die through a local power mesh.

17. An apparatus, comprising:
a substrate provided with power TSVs running through it;
a top metal layer;
first CSVs connecting the power TSVs with the top metal layer, the power TSVs aligned with the first CSVs; and
one or more power gates provided on an upper surface of the substrate, each power gate coupled to one end of at least one CSV, and further coupled to a local power delivery system of the apparatus.

18. The apparatus of claim 17, wherein the local power delivery system includes a local power mesh configured to deliver a current to transistors on the top metal layer.

19. The apparatus of claim 18, wherein the local power delivery system includes vertical conduits, parallel to the CSVs, crossing through one or more intermediate metal layers between the substrate and the top metal layer.

20. The apparatus of claim 17, wherein the power delivery system includes:
local power first TSVs provided in the substrate;
one or more backside metal layers provided adjacent to a bottom side of the substrate, the local power first TSVs coupled to the power gate and to the one or more backside metal layers; and
one or more finer pitch second TSVs provided in the substrate, configured to connect the one or more backside metal layers directly to at least one of:
transistor wells of the apparatus, or power rails buried in the substrate.

* * * * *